(12) United States Patent
Fukuyama

(10) Patent No.: US 7,060,909 B2
(45) Date of Patent: Jun. 13, 2006

(54) COMPOSITION FOR FORMING LOW DIELECTRIC CONSTANT INSULATING FILM, METHOD OF FORMING INSULATING FILM USING THE COMPOSITION AND ELECTRONIC PARTS HAVING THE INSULATING FILM PRODUCED THEREBY

(75) Inventor: Shun-ichi Fukuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 319 days.

(21) Appl. No.: 10/194,318

(22) Filed: Jul. 15, 2002

(65) Prior Publication Data
US 2003/0010961 A1 Jan. 16, 2003

(30) Foreign Application Priority Data
Jul. 16, 2001 (JP) .............................. 2001-215911

(51) Int. Cl.
*H01B 17/60* (2006.01)
*E04B 1/62* (2006.01)

(52) U.S. Cl. .............................. 174/138 C; 174/119 C; 174/137 R; 252/62

(58) Field of Classification Search .................. 252/62; 174/119 C, 137 R, 138 C
See application file for complete search history.

(56) References Cited

U.S. PATENT DOCUMENTS

| | | | |
|---|---|---|---|
| 4,421,904 A * | 12/1983 | Eckberg et al. ............... 528/27 |
| 4,767,797 A * | 8/1988 | Ai et al. ......................... 522/8 |
| 6,110,814 A | 8/2000 | Tokumasu et al. .......... 438/597 |
| 6,281,113 B1 | 8/2001 | Maeda ........................ 438/624 |
| 6,703,132 B1 * | 3/2004 | Yasuda et al. .............. 428/447 |
| 6,783,917 B1 * | 8/2004 | Blakeney et al. ......... 430/270.1 |
| 2001/0010840 A1* | 8/2001 | Kobayashi et al. ......... 427/503 |
| 2003/0110630 A1* | 6/2003 | Onishi et al. ................. 29/856 |

FOREIGN PATENT DOCUMENTS

| EP | 1 223 192 A1 | 7/2002 |
|---|---|---|
| JP | 9-298241 | 11/1997 |
| JP | 11-31690 | 2/1999 |
| JP | 11-217458 | 8/1999 |
| JP | 11-330069 | 11/1999 |
| JP | 2000-77399 | 3/2000 |

OTHER PUBLICATIONS

International Publication No. WO 00/61834, published Oct. 19, 2000.

* cited by examiner

*Primary Examiner*—Hoa Van Le
(74) *Attorney, Agent, or Firm*—Arent Fox PLLC

(57) ABSTRACT

A composition for the formation of an insulating film comprising a low dielectric constant polymeric material and a sublimating material, which are dissolved in a solvent. Preferred low dielectric constant polymeric materials include polyaryl ethers. Preferred sublimating materials include silicone compounds having a closed stereostructure having atoms at its vertexes, such as those known as Si-T8 and Si-T12. A method of forming a low dielectric constant insulating film and electronic parts or components using an insulating film formed thereby are also disclosed.

2 Claims, 4 Drawing Sheets

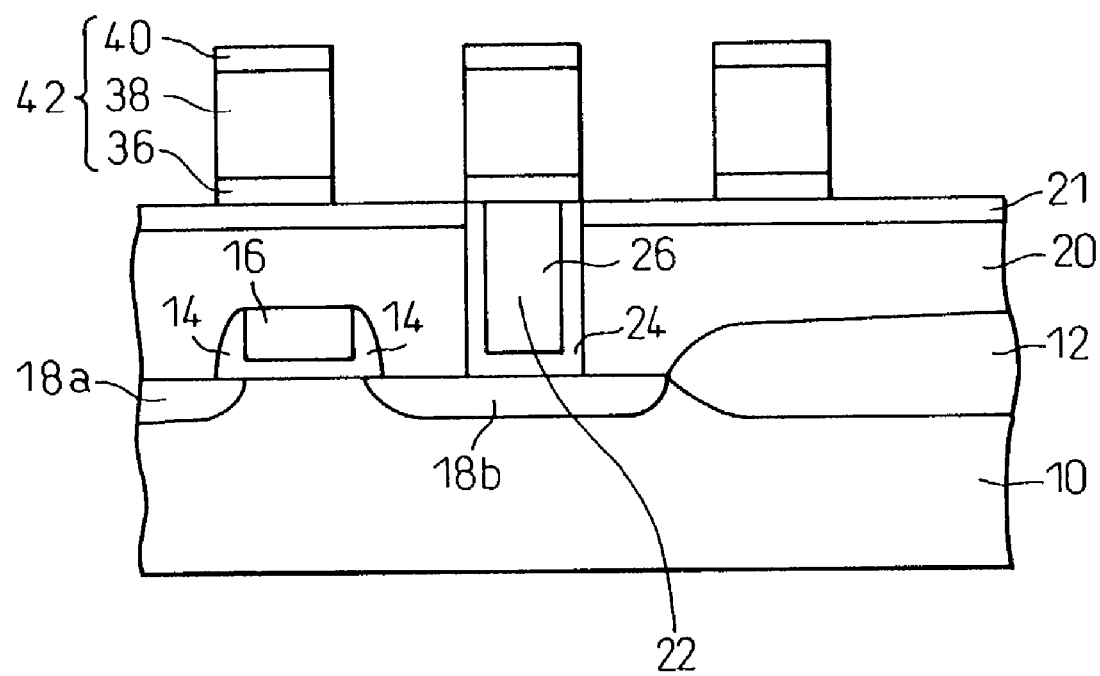

COMPOSITION FOR FORMING LOW DIELECTRIC CONSTANT INSULATING FILM, METHOD OF FORMING INSULATING FILM USING THE COMPOSITION AND ELECTRONIC PARTS HAVING THE INSULATING FILM PRODUCED THEREBY

CROSS-REFERENCE TO RELATED APPLICATIONS

This application is based upon and claims the priority of Japanese Patent Application No. 2001-215911, filed on Jul. 16, 2001, the contents thereof being incorporated herein by reference.

BACKGROUND OF THE INVENTION

1. Field of the Invention

The invention relates to a material suitable for the formation of an insulating film having a low dielectric constant. The invention also relates to a method for forming an insulating film having a low dielectric constant using the material, and electric parts or components which use an insulating film formed thereby. The electric parts or components include various parts or components in which a low dielectric constant insulating film is particularly advantageously used, such as semiconductor integrated circuits and circuit boards, as well as display devices and phase filters.

2. Description of the Related Art

By way of typical example, in multilayered wiring lines in multilayer wiring circuits represented by semiconductor integrated circuits, a decrease in signal transmission speed due to the parasitic capacitance of an insulating film is known.

The transmission speed of a signal is determined by the resistance of a wiring line and the parasitic capacitance between wiring lines. In general, a wiring delay (T) is influenced by a wiring resistance (R) and a capacitance (C) between wiring lines, and is represented by the following equation:

$$T \propto CR \tag{1}$$

wherein the capacitance (C) between wiring lines has a relation with the dielectric constant ($\in_r$) of an insulating film between the wiring lines, as represented by the following:

$$C = \in_0 \in_r S/d \tag{2}$$

wherein $\in_0$ denotes the dielectric constant of a vacuum, S denotes an electrode area, and d denotes a distance between wiring lines.

Although at a distance between wiring lines of 1 micrometer or more, the influence of the wiring delay to the speed of the entire device was small, at a distance between wiring lines of 0.5 micrometer or less, the influence becomes not negligible. As is clear from the above equation, when the distance d between wiring lines becomes smaller due to the increase in degree of integration of semiconductor devices, the parasitic capacitance (capacitance between wiring lines) C increases. Although the capacitance of an insulating layer participating in the parasitic capacitance can be decreased by making the thickness of the wiring lines smaller and making the sectional area of the insulating film smaller, the smaller thickness of the wiring line gives rise to the increase in the resistance of the wiring line and, consequently, does not lead to a higher device speed. Thus, a decreased dielectric constant of an insulating film material itself is essential for a decrease in the parasitic capacitance and, if a circuit having a distance between wiring lines of 0.3 micrometer or smaller is formed in future, the effect of the parasitic capacitance between the wiring lines on the device speed will be large. Particularly, in the generation of a further decreased distance between the wiring lines, of 0.2 micrometer or smaller, it is expected that the dielectric constant of an insulating film will have a large effect on the signal transmission speed, and will be a large factor controlling the performance of semiconductor devices.

The insulating film materials mainly used in semiconductor integrated circuits, in which a low dielectric constant insulating film is particularly demanded, are silicon oxide ($SiO_2$) and fluorine-doped $SiO_2$ (FSG) produced by a chemical vapor deposition (CVD) process, and the like. It is known that the films formed of these materials have a dielectric constant of 3.6 at the lowest, although the value of dielectric constant varies depending on the conditions in which the film is deposited. Although insulating films based on silicon oxide formed by heat-treating a coated spin-on glass (SOG) are also known, they have a high moisture absorption and the dielectric constant of substantially 5 or higher.

Recently, polymeric materials based on polytetrafluoroethylene (PTFE) or a hydrocarbon have been proposed as insulating materials of low dielectric constant. However, the PTFE-based materials have problems in terms of thermal resistance and adhesion to other materials. On the other hand, of the hydrocarbon-based materials, materials based on linear hydrocarbons are regarded as having problems in terms of poor thermal resistance and variation in dielectric constant due to moisture absorption when polar groups are introduced to improve adhesion. Although materials based on aromatic hydrocarbons are advantageous in terms of thermal resistance relative to those based on linear hydrocarbons, their dielectric constant is 2.7 at the lowest.

In addition, there has been an attempt to provide an insulating film having a lower dielectric constant by making a film from a silicone material mixed with a compound to be removed at a low temperature, removing the compound from the film after the crosslinking of the silicone material, to thereby make the film have a low density. However, the resultant film has a small strength, and the technique of chemical mechanical polishing (CMP), which is a currently the standard technique for planarization, cannot be applied.

SUMMARY OF THE INVENTION

It is an object of the invention to provide a composition suitable for the formation of insulating films having a low dielectric constant, such as those useful to decrease the parasitic capacitance generated between wiring lines in a multilayered wiring structure of a semiconductor integrated circuit.

It is also an object of the invention to provide a method of forming an insulating film having a low dielectric constant from such a material.

In addition, it is an object of the invention to provide electronic parts or components using the formed insulating film having a low dielectric constant.

The composition for the formation of an insulating film of the invention comprises a low dielectric constant polymeric material and a sublimating material, which are dissolved in a solvent.

According to the invention, a low dielectric constant insulating film can be made by forming a film on a substrate using a composition containing a low dielectric constant polymeric material and a sublimating material, which are dissolved in a solvent, and then removing the sublimating material from the film.

According to the invention, there are also provided electric parts or components having a low dielectric constant insulating film formed from the composition for forming an insulating film of the invention.

BRIEF DESCRIPTION OF THE DRAWINGS

The above and other objects and advantages of the invention will be understood and appreciated, by a person with ordinary skill in the art, from consideration of the following detailed description made by referring to the attached drawings, wherein:

FIG. 1 is an illustration of the substrates used in the Examples, the substrates having transistors formed thereon;

DETAILED DESCRIPTION OF THE INVENTION

Figure 2A:
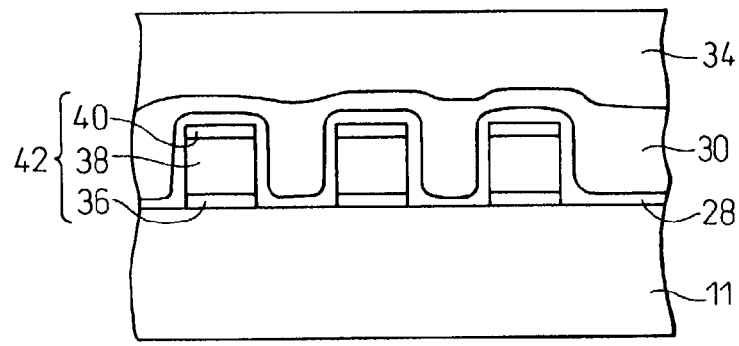
FIGS. 2A to 2C illustrate the steps in Example 1.

The composition for forming an insulating film of the invention comprises a low dielectric constant polymeric material and a sublimating material, which are dissolved in a solvent.

The low dielectric constant polymeric material is preferred to be soluble in a solvent, and to be a material such that an insulating film formed by coating a solution containing the material on a substrate and then treating the coating has a sufficient thermal resistance. The treatment for forming the insulating film is, in general, a treatment for the crosslinking or curing of the polymeric material, which may be a common treatment, such as heating or UV irradiation. Although the dielectric constant of the insulating film formed from the composition of the invention varies depending on the amount of a sublimating material, as described below, it is preferred that the polymeric material itself has a lower dielectric constant.

Materials preferred to be used as a low dielectric constant polymeric material in the invention include materials having unsaturated bonds, such as polyaryl ethers (which are represented by SiLK available from The Dow Chemical or FLARE available from Honeywell) and benzocyclobutene (BCB) (available from The Dow Chemical). It is also possible to use polyimides.

The sublimating material must be soluble, along with the low dielectric constant polymeric material, in a solvent, and to be capable of being easily removed by the sublimation from an insulating film formed from a coated solution. Preferred sublimating materials include a silicone compound known as Si-T8. Si-T8 is a compound having a stereostructure in the shape of a dice in which eight silicon atoms are located at vertexes. Compounds having a box- or sphere-like closed stereostructure (a structure containing an inner space) having a number of silicon atoms, other than eight, for example, twelve or eighteen silicon atoms, located at vertexes (which are similarly called Si-T12 or Si-T18, respectively), are also known, and can be used as the sublimating material. These silicone compounds can be represented by the following general formula:

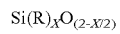

$Si(R)_xO_{(2-X/2)}$ wherein R is hydrogen or an alkyl or substituted alkyl containing one to five carbon atoms, the substituent of the substituted alkyl being an alkyl containing one to five carbon atoms or an aromatic group containing one to two rings, and the respective Rs in a molecule can be the same as or different from each other, and x denotes a number of 0.5 to 1. A slicone compound having a closed stereostructure is very advantageous because the sublimating temperature can be easily controlled depending on the number of silicon atoms.

The low dielectric constant polymeric material and the sublimating material are dissolved in an organic solvent to provide the composition for forming an insulating film of the invention. Any solvent can be used provided that the polymeric material and sublimating material to be used are dissolved in the solvent to form a coated film having a certain thickness, and that the solvent can be then easily removed from the coated film.

The composition of the invention forms a film by crosslinking or curing the polymeric material after the removal of the solvent, and then the film is made porous by heating the film to a temperature effective for the sublimation of the sublimating material and sublimating it from the film, to thereby provide an insulating film having a lowered dielectric constant. The dielectric constant of the resultant insulating film varies depending on the amount of the sublimating material removed by the sublimation. Accordingly, the mixed ratio of the low dielectric constant polymeric material and the sublimating material in the composition of the invention should be determined depending mainly on an objective dielectric constant of an insulating film to be formed and in terms of other properties which the insulating film must have (e.g., mechanical strength). The insulating film formed from the composition of the invention having an adequate mixed ratio can achieve a dielectric constant of 2.5 or lower while satisfying other required properties.

To form an insulating film having a low dielectric constant using the composition of the invention, first, the composition is coated on a substrate, on which an insulating film is to be formed, by an appropriate method, such as a spin coat method, to form a coated film, and a solvent is removed from the coated film by heating. The low dielectric constant polymeric material is then crosslinked or cured to form a hardened film by a technique, such as a heat treatment, UV irradiation, or a combination of heat treatment and UV irradiation, depending on the type of the polymeric material used. Subsequently, the hardened film is heated to a temperature equal to or higher than the sublimating temperature of the sublimating material, to thereby sublimate the sublimating material to make the film porous and to produce an insulating film having a low dielectric constant.

The sublimation of the sublimating material may be carried out following the crosslinking or curing of the polymeric material, or may be carried out after a separate interposed process. For example, in the case where the invention is applied to an insulating film in which wiring lines are formed by a damascene process in the fabrication of a multilayered circuit board, it is possible to remove the sublimating material from the insulating film by heating the film after forming the insulating film, forming grooves for the wiring lines in the film, filling a wiring material in the grooves, and removing excess wiring material.

Although the sublimation of the sublimating material may be carried out in any atmosphere, it is preferred to be carried out in an atmosphere of inert gas, such as nitrogen, in order to avoid adverse effects, such as the oxidation of the insulating film, induced by heating. Sublimation in a vacuum atmosphere is also possible, which is favorable for the promotion of the sublimation.

The thickness of the insulating film to be formed can be controlled by the contents of solids (the low dielectric constant polymeric material and the sublimating material) of the composition to be coated and conditions of coating the composition (in the case of spin coating, the number of revolutions of a coated substrate, the time of coating and the like), and the dielectric constant thereof can be controlled by the type and the content of the sublimating material which the composition contains.

The low dielectric constant insulating film obtained by the invention can be used in various electronic parts or components. As representative electronic parts, multilayered wiring circuits, such as semiconductor integrated circuits, can be enumerated. However, the insulating film obtained by the invention can also be used in other various electronic parts in which a low dielectric constant film is also desired, such as display devices or phase filters.

Figure 4:
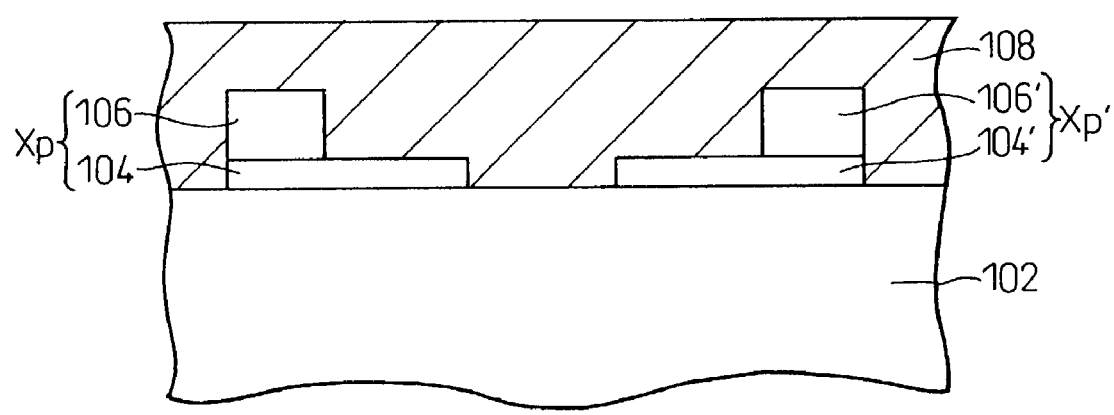
FIG. 4 is a schematic view illustrating a display device using a low dielectric constant insulating film according to the invention.

An example of a display device using an low dielectric constant insulating film is shown in FIG. 4. The device shown in the drawing has a basic structure of a PDP of a reflection type. In this type of display device, transparent electrodes 104, 104' are located on a glass substrate 102 and, on the electrodes, metal films 106, 106' are positioned to make up a pair of main electrodes Xp, Xp' for discharge. As a dielectric layer 108 covering the main electrodes Xp, Xp' of such a display device, the low dielectric constant insulating film obtained according to the invention can be used.

EXAMPLES

The invention will be further described by the following examples. The examples presented herein do not limit the invention.

Preparation of Composition for the Formation of Insulating Film

A solution was prepared by adding Si-T8 having a dice-like structure (2,4,6,8,10,12,14,16-octamethylcyclooctasiloxane, manufactured by Aldrich) in a polyaryl ether (polymer) solution (SiLK, manufactured by The Dow Chemical), in an amount of 5% by weight, based on the polymer. The solution was then filtered by a 0.2 micrometer membrane filter to be used as a sample solution.

Example 1

A low dielectric constant insulating film was formed on a processed substrate, having transistors fabricated and aluminum (Al) wiring lines provided, from the above sample solution. The processed substrate used is illustrated in FIG. 1. It comprised a silicon substrate 10 isolated by isolating films 12 and provided with side wall insulating films 14, gate electrodes 16, diffused source/drain layers 18a, 18b, an interlayer insulating film 20 of phosphor silicate glass, a stopper film 21, contact holes 22 filled with a barrier layer 24 and a contact plug 26 of tungsten (W), and wiring lines 42 made up of a barrier metal 36, an Al conductor 38 and a top metal 40.

As shown in FIG. 2A, on the processed substrate 11 which had been processed up to the formation of the wiring lines 42 (0.6 micrometer thick) (the stopper layer 21 and the members therebelow are not shown to simplify the drawing), an $SiO_2$ film was formed as a liner film 28 to a thickness of 30 nanometers, after which the sample solution was coated by a spin coat process at the conditions of 3000 rpm and 30 seconds (the conditions allowing the solution to be coated on the processed substrate in a thickness of 0.8 micrometer), and was heat-treated at 50° C. for 3 minutes. The polymer was then crosslinked by UV irradiation for 3 minutes using a 1000-watt high-pressure mercury lamp to form a hardened insulating film 30, and the sublimating material (Si-T8) was removed from the insulating film 30 by a heat treatment at 300° C. for 30 minutes. Subsequently, an $SiO_2$ film was formed as a cap layer 34, and was planarized by a chemical mechanical polishing (CMP) technique.

Figure 2B:
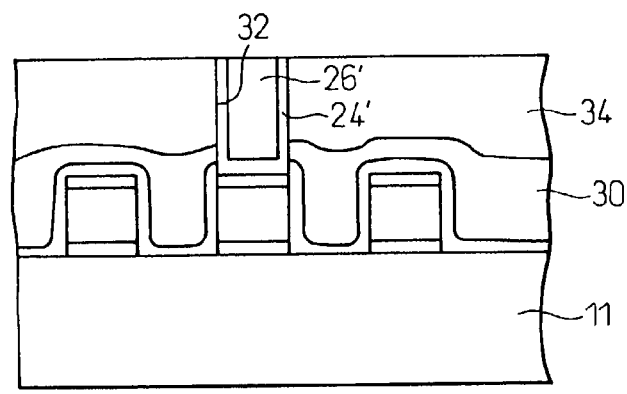

A via pattern was then transferred to the insulating film 30 and the overlaying cap layer 34 to form via holes 32 by a conventional process using a resist (not shown), and the resist was removed by a plasma process. As shown in FIG. 2B, a barrier layer 24' was formed in the via hole 32, after which tungsten was filled in the via hole 32 by a CVD process to form a via 26', and the excess material above the cap layer 34 was removed by CMP. Among the vias 26' thus obtained, no blackened portion showing insufficient filling was observed, and no insufficient continuity was observed.

Figure 2C:
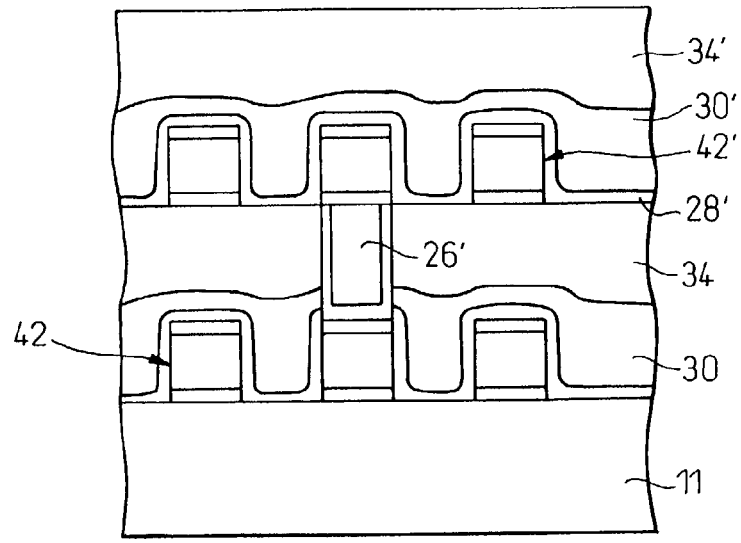

After the formation of the vias 26', it is possible to form, by a similar procedure, further wiring lines 42', a liner film 28' covering it, a low dielectric constant insulating film 30', and a cap layer 34', as shown in FIG. 2C, and a device provided with a required number of multi wiring layers can be manufactured. In some cases, it is also possible to form only some of insulating films of a multilayered wiring structure from the composition for a low dielectric constant insulating film of the invention.

Example 2

This example was the same as Example 1 except that the sublimating material was not removed from the insulating film after the crosslinking of the polymer as in Example 1, but was removed after the CMP process following the formation of vias 26' described in Example 1 making reference to FIG. 2B. The conditions of the heat treatment for the removal of the sublimating material were 300° C. and 30 minutes in a nitrogen atmosphere. Also in this case, no blackened portion and no insufficient continuity were observed.

Example 3

A substrate 11' (FIG. 3A), in which the isolation and the steps up to the formation of tungsten plugs for metallization had been finished, was prepared. This substrate 11' represents that shown in FIG. 1, in which the steps of the formation of the tungsten plug and the etching stopper layer 21 were finished.

Figure 3A:
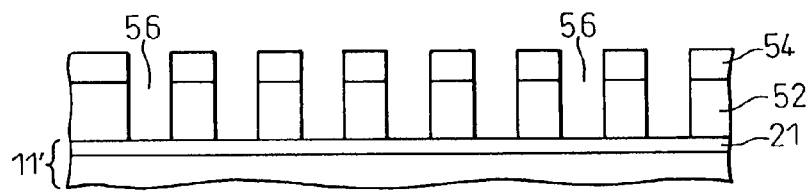
FIGS. 3A to 3D illustrate the steps in Examples 3 and 4.

The sample solution was coated on the substrate 11' by a spin coat process at the conditions of 4000 rpm and 30 seconds (the conditions allowing the solution to be coated on the substrate 11' at a thickness of 0.3 micrometer), and heat-treated at 50° C. for 3 minutes, after which the polymer was crosslinked by UV irradiation for 3 minutes using a 1000-watt high-pressure mercury lamp, to thereby form a wiring interlayer film 52 as shown in FIG. 3A. A cap layer 54 was formed on this layer 52, and grooves 56 of a first wiring layer pattern were formed in the cap layer 54 and the wiring interlayer film 52.

Figure 3B:
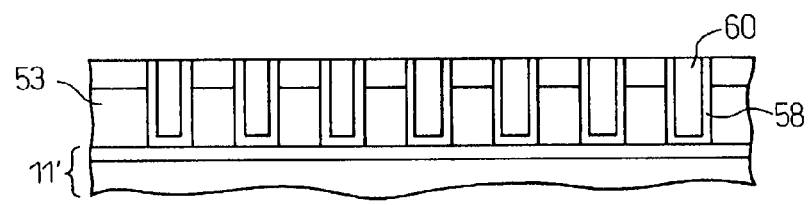

Films of TaN for a barrier metal layer and Al for a conductor plug were then formed, and the materials at portions other than the wiring grooves 56 were removed by CMP, to thereby form a barrier metal layer 58 and a conductor plug 60 of Al, as shown in FIG. 3B. Subsequently, the substrate was subjected to a heat treatment in an inert gas (N$_2$ gas) at 300° C. for 30 minutes, and the sublimating material was removed from the wiring interlayer film identified by reference numeral 52 in FIG. 3A, to thereby form a low dielectric constant insulating film 53 (FIG. 3B).

Figure 3C:
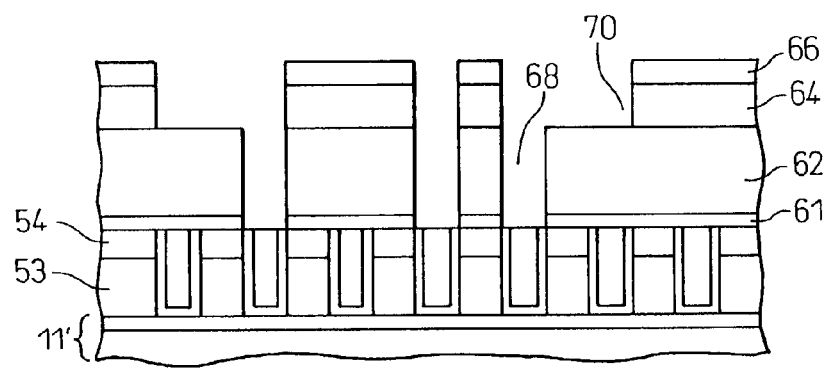

As shown in FIG. 3C, an SiO$_2$ insulating film 62 having a thickness of 500 nanometers was then formed for a via interlayer film, after which the sample solution was coated thereon by a spin coat process again at the conditions of 4000 rpm and 30 seconds (the conditions allowing the solution to be coated at the thickness of 0.3 micrometer), and was heat-treated at 50° C. for 3 minutes, followed by UV irradiation for 3 minutes using a 1000-watt high pressure mercury lamp, to thereby crosslink the polymer to form a wiring interlayer insulating film 64. (The layer 61 found under the SiO$_2$ insulating film 62 in FIG. 3C is a copper-diffusion barrier layer which is needed when the material for the vias and wiring lines is not aluminum but copper (see Example 4), and is not needed in this example using aluminum.) After the formation of a cap film 66 on the wiring interlayer insulating film 64, grooves 68 of a via hole pattern were formed in the SiO$_2$ insulating film 62, and grooves 70 of a second wiring layer pattern was formed in the wiring interlayer insulating film 64 and the cap film 66.

Figure 3D:
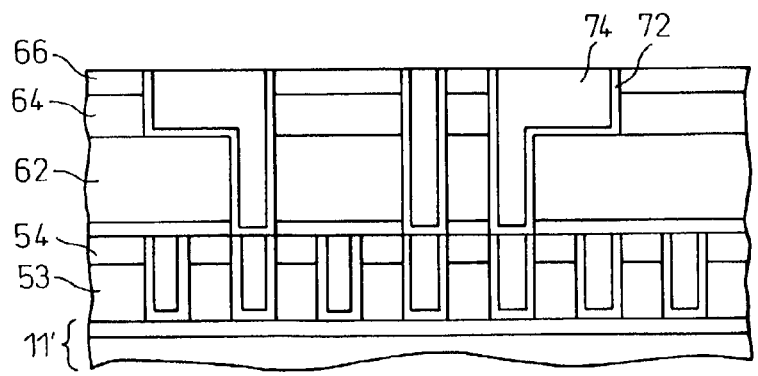

As shown in FIG. 3D, wiring materials are filled in the patterned grooves 68 and 70 as in the first wiring layer, to form a barrier metal layer 72 and a conductor plug and wiring line 74 of Al, and the materials at the portions other than the wiring grooves were removed by CMP. Subsequently, the wiring interlayer film 64 was heat-treated in an inert gas at 300° C. for 30 minutes to have a low dielectric constant. Lastly, an SiO$_2$ film having a thickness of 100 nanometers and an SiN film having a thickness of 500 nanometers were formed for the prevention of moisture absorption of the wiring interlayer film, and Al pads were formed according to a conventional process, although they are not shown in the drawing.

Measurement of the dielectric constant using a MOS structure which had an insulating film formed from the sample solution at the same conditions revealed that the insulating film had a dielectric constant of 2.2. A speed of response of the device obtained in this example was compared with a device manufactured using only SiO$_2$ for an insulating film, and an improvement in the speed of about 25% was observed.

Example 4

A substrate 11' (FIG. 3A) similar to that used in Example 3, in which the isolation and the steps up to the formation of tungsten plugs for metallization had been finished, was prepared. The sample solution was coated on the substrate 11' by a spin coat process at the conditions of 4000 rpm and 30 seconds (the conditions allowing the solution to be coated on the substrate 11' at a thickness of 0.3 micrometer), and heat-treated at 50° C. for 3 minutes, after which the polymer was crosslinked by UV irradiation for 3 minutes using a 1000-watt high-pressure mercury lamp, to thereby form a wiring interlayer film 52 as shown in FIG. 3A. A cap layer 54 was formed on this layer 52, and grooves 56 of a first wiring layer pattern were formed in the cap layer 54 and the wiring interlayer film 52.

Films of TaN for a barrier metal layer, seed Cu, and electroplated Cu were then formed successively to fill the wiring grooves 56, and the materials at portions other than the wiring grooves 56 were removed by CMP, to thereby form a barrier metal layer 58 and a conductor plug 60 of Cu, as shown in FIG. 3B. Subsequently, the substrate was subjected to a heat treatment in a vacuum (0.0133 Pa (1×10$^{-4}$ Torr)) at 300° C. for 30 minutes, and the sublimating material was removed from the wiring interlayer film identified by reference numeral 52 in FIG. 3A, to thereby form a low dielectric constant insulating film 53 (FIG. 3B).

As shown in FIG. 3C, an SiN film having a thickness of 70 nanometers for the prevention of diffusion of Cu was formed, after which an SiO$_2$ insulating film 62 having a thickness of 500 nanometers was formed for a via interlayer film. Subsequently, the sample solution was coated by a spin coat process again at the conditions of 4000 rpm and 30 seconds (the conditions allowing the solution to be coated at the thickness of 0.3 micrometer), and was heat-treated at 50° C. for 3 minutes, followed by UV irradiation for 3 minutes using a 1000-watt high pressure mercury lamp, to thereby crosslink the polymer to form a wiring interlayer insulating film 64. After the formation of a cap film 66 on the wiring interlayer insulating film 64, grooves 68 of a via hole pattern were formed in the SiO$_2$ insulating film 62, and grooves 70 of a second wiring layer pattern was formed in the wiring interlayer insulating film 64 and the cap film 66.

As shown in FIG. 3D, wiring materials are filled in the patterned grooves 68 and 70 as in the first wiring layer, to form a barrier metal layer 72 and a conductor plug and wiring line 74 of Cu, and the materials at the portions other than the wiring grooves were removed by CMP. Subsequently, the wiring interlayer film 64 was heat-treated in a vacuum (0.0133 Pa (1×10$^{-4}$ Torr)) at 300° C. for 30 minutes to have a low dielectric constant. Lastly, an SiN film having a thickness of 70 nanometers was formed for the prevention of oxidation of Cu, and an SiO$_2$ film having a thickness of 100 nanometers and an SiN film having a thickness of 500 nanometers were formed, after which Al pads were formed according to a conventional process, although they are not shown in the drawing.

A speed of response of the device obtained in this example was compared with a device manufactured using only SiO$_2$ for an insulating film (wiring interlayer film), and an improvement in speed of about 25% was observed.

As described above, according to the invention, it is possible to form an insulating film having a low dielectric constant (2.5 or lower) which is capable of filling narrow gaps and can withstand CMP, to make the formation of high-speed, multilayered circuit board having a small wiring delay feasible. The insulating film according to the invention can withstand a CMP process used for buried wiring lines and, according to the invention, forming a low dielectric constant insulating film after the polishing by CMP becomes possible. Such a low dielectric constant insulating film is capable of being used in not only multilayered circuit boards chiefly described herein but also various electronic parts or components, including display devices, phase filters and the like.

What is claimed is:

1. A composition for the formation of an insulating film comprising a low dielectric constant polymeric material and a sublimating material, which are dissolved in a solvent, wherein the sublimating material is a silicone compound having a closed stereostructure having atoms at its vertexes, and wherein the silicone compound is Si-T8 having eight silicon atoms.

2. A composition for the formation of an insulating film comprising a low dielectric constant polymeric material and a sublimating material, which are dissolved in a solvent, wherein the sublimating material is a silicone compound having a closed stereostructure having atoms at its vertexes and the stereostructure contains an inner space, wherein the silicone compound is represented by the following general formula:

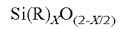

wherein R is hydrogen or an alkyl or substituted alkyl containing one to five carbon atoms, the substituent of the substituted alkyl being an alkyl containing one to five carbon atoms or an aromatic group containing one to two rings, and the respective Rs in a molecule can be the same as or different from each other, and x denotes a number of 0.5 to 1, and wherein the silicone compound is Si-T12 having twelve silicon atoms or Si-T18 having eighteen silicon atoms.

* * * * *